United States Patent [19]
Ohashi

[11] Patent Number: 5,299,941
[45] Date of Patent: Apr. 5, 1994

[54] CONNECTING TERMINAL AND A CONNECTING TERMINAL ASSEMBLY

[75] Inventor: Koji Ohashi, Kawagoe, Japan

[73] Assignee: Kyoshin Kogyo Co, Ltd., Tokyo, Japan

[21] Appl. No.: 924,912

[22] Filed: Aug. 5, 1992

[30] Foreign Application Priority Data

Jul. 10, 1992 [JP] Japan .................................. 4-183437

[51] Int. Cl.$^5$ ............................................. H01R 9/09
[52] U.S. Cl. ...................................... 439/78; 439/885
[58] Field of Search ................... 439/55, 78, 80, 81, 439/82, 83, 84, 746, 885

[56] References Cited

U.S. PATENT DOCUMENTS

| | | | |
|---|---|---|---|
| 3,129,814 | 4/1964 | Cheh et al. | 439/885 X |
| 4,688,866 | 8/1987 | Legrady | 439/78 |
| 4,790,764 | 12/1988 | Kawaguchi et al. | 439/78 |
| 5,141,450 | 8/1992 | Kikuchi et al. | 439/885 X |

OTHER PUBLICATIONS

IBM Technical Disclosure Bulletin, vol. 34, No. 4A, Sep. 1991.

*Primary Examiner*—Larry I. Schwartz
*Assistant Examiner*—Khiem Nguyen

[57] ABSTRACT

A connecting terminal for establishing electrical connection between a conduction path on a circuit board and an external electric circuit comprises first, second, and third legs integrally formed on a plate-shaped body. The first and second legs are arranged on either side of the body in the crosswise direction of the body, and the third leg is located halfway between the first and second legs. The three terminal legs of the connecting terminal are inserted individually in separate through holes in the circuit board and soldered, whereby the connecting terminal is connected electrically and mechanically to the circuit board. An external force applied to the connection terminal is received by the three legs and one of first and second supporting portions protruding individually from two opposite major surfaces of the connecting terminal body in first and second edge regions, which corresponds to the acting direction of the external force.

17 Claims, 4 Drawing Sheets

CONNECTING TERMINAL AND A CONNECTING TERMINAL ASSEMBLY

BACKGROUND OF THE INVENTION

The present invention relates to a connecting terminal for establishing electrical connection between a conduction path on a circuit board, e.g., a conductor pattern on a printed board, and an external electric circuit, and a connecting terminal assembly including a plurality of connecting terminals of the aforementioned type and adapted for use with an automatic connecting terminal loader, and more particularly, to a connecting terminal having three legs for higher strength of attachment to a circuit board and a connecting terminal assembly including a plurality of connecting terminals adhered, by means of tape, to a lead frame transported by means of an automatic loader.

Electrically connecting a conductor pattern on a printed board and an external electric circuit by means of a connecting terminal is a known technique. Electrical connection is achieved, for example, by fitting a receptacle, which is connected to the external circuit, on a tab terminal serving as the connecting terminal, or by winding around and soldering a lead wire, connected to the external circuit, to a lug terminal as the connecting terminal.

The conventional connecting terminal, which typically comprises a plate-shaped body and two legs formed integrally therewith, is mounted on the printed board by soldering the terminal legs, inserted individually into through holes formed in the printed board, to the conductor pattern. By doing this, the connecting terminal is connected to the printed board both electrically and mechanically. In some cases, an external force may be applied to the connecting terminal on the printed board during the assembly or manufacture of the printed board and its peripheral components, including mounting the connecting terminal and other necessary electric and electronic components on the printed board and connecting the receptacle or lead wire to the connecting terminal, or during the use of the printed board thereafter. Accordingly, the connecting terminal should be firmly attached to the printed board.

For example, to increase the strength of attachment of the connecting terminal to the printed board, a conventional tab terminal has its body which is provided at a portion thereof adjacent to the terminal legs with fall-proof projection means adapted to engage the face of the printed board when the legs are inserted into the through holes of the printed board, thereby supporting the terminal, as disclosed in Japanese provisional utility model publication no. 3-69866. The projection means is provided with a first projection protruding from the other major surface of the terminal body, in a region ranging from the middle point between the two legs, first and second, to the first leg, and a second projection protruding from the other major surface of the terminal body, in a region ranging from the middle point between the two legs to the second leg. Each projection has the shape of a hollow quarter ellipsoid which may be obtained by quadrisecting a hollow ellipsoid of revolution, so that the bottom surface of each projection is brought into engagement with the face of the printed board along a semicircular arc.

According to the conventional tab terminal, having the first and second legs and the fall-proof projection means including the first and second projections, if an external force directed from the major surface of the tab terminal for the first projection to the major surface for the second projection is applied to the tab terminal, it is received by the first and second legs and the outermost region of an arcuate contact portion of the bottom surface of the second projection which engages the face of the printed board. The outermost region of the arcuate contact portion of the second projection is situated at a distance equivalent to about ¼ of the distance between the first and second legs, from the first leg, in the direction of an imaginary line connecting the first and second legs, and is hence deviated from the center of the tab terminal toward the second leg in the direction of the imaginary line. Thus, the first and second legs and the outermost region of the contact portion of the second projection situated close to the second leg, which receive the external force acting in the aforementioned direction, form a scalene triangle, as a whole, on the face of the printed board. In other words, when the external force acts on the tab terminal, the first one of the two legs is subjected to a heavier load. In some cases, therefore, the first leg may be lifted off the printed board. If the conventional tab terminal is subjected to an external force which acts in the direction opposite to the aforesaid one and is received by the two legs and the first projection, the second leg may possibly be lifted off for the aforementioned reason. Thus, the conventional tab terminal is liable to lack in the strength of attachment to the printed board.

Thereupon, the attachment strength may be further increased by widening the sectional area of each leg of the tab terminal. If this is done, however, each terminal leg is increased in size, and hence in thermal capacity, so that flow soldering is prone to fail.

As in the arrangement disclosed in Japanese provisional utility model publication no. 3-77378, moreover, the attachment strength of the tab terminal can be increased by providing the terminal body with a plate-shaped extension formed integrally with the body and extending between the two legs of the terminal. In this case, the terminal legs and the extension are inserted in a slit-like through hole or elongated slot formed in the printed board, and are soldered to the conductor pattern on the printed board. If an external force acts on the tab terminal arranged in this manner, however, the conductor pattern is liable to be subjected to a great force and damaged thereby, due to the existence of the elongated slot in the printed board.

OBJECT AND SUMMARY OF THE INVENTION

An object of the present invention is to provide a connecting terminal having increased strength of attachment to a circuit board, capable of preventing a conduction path on the printed board from being damaged, and having a small thermal capacity which facilitates satisfactory flow soldering.

Another object of the present invention is to provide a connecting terminal assembly including a plurality of connecting terminals of the aforesaid type and adapted for use with an automatic connecting terminal loader.

In order to achieve the above objects, according to one aspect of the present invention, there is provided a connecting terminal for establishing electrical connection between a conduction path on a circuit board and an external electric circuit. The connecting terminal comprises a plate-shaped body; first and second legs arranged on opposite sides of the body in the width direction thereof, and a third leg located halfway between the first and second legs, the first, second and third legs being formed integrally with the body and being inserted individually in separate through holes formed in the circuit board; a first supporting portion for supporting the body on the circuit board, the first supporting portion protruding from one major surface of the body in a first edge region of the body ranging from the first leg to the third leg; and a second supporting portion for supporting the body on the circuit board, the second supporting portion protruding from the other major surface of the body in a second edge region of the body ranging from the second leg to the third leg.

Preferably, each of the first and second supporting portions is formed into a shape such that each supporting portion has a contact surface which is adapted to engage the circuit board when the first, second, and third legs are inserted individually into the through holes of the circuit board, and which has its outermost region which cooperates with the third leg and a corresponding one of the first and second legs to form an isosceles triangle on the face of the circuit board. Further, the connecting terminal is a tab terminal which has the body thereof fitted with a receptacle connected to the external electric circuit, or a lug terminal which has the body thereof around which a lead wire connected to the external circuit is wound. Furthermore, at least one of the first, second, and third legs is provided with an outwardly projecting stopper knot formed integrally therewith.

According to another aspect of the present invention, there is provided a connecting terminal assembly which comprises a lead frame formed with a plurality of holes which are arranged at regular intervals and into which feed teeth of a sprocket of an automatic loader are engagedly fitted, and a plurality of connecting terminals arranged at regular intervals on the lead frame and used individually for electrical connection between a conduction path on a circuit board and an external electric circuit. Each connecting terminal of the connecting terminal assembly, which is constructed in the same manner as the connecting terminal according to the first aspect of the present invention, comprises the plate-shaped body, the first to third legs, and the first and second supporting portions.

Preferably, the plurality of connecting terminals are adhered to the lead frame by means of tape.

The present invention is advantageous in that the connecting terminal is provided with the first, second, and third legs, which are formed integrally with the body and are inserted individually in the separate through holes in the circuit board, and the first and second supporting portions which, protruding individually from the two major surfaces of the body in the first and second edge regions of the body, serve to support the body on the circuit board, so that an external force acting on the connecting terminal can be received by the three legs and either one of the two supporting portions determined in dependence on the acting direction of the external force, during the assembly or manufacture of the circuit board and its peripheral components or during the use of the circuit board. Accordingly, loads act on the legs without any substantial imbalance, and the connecting terminal can satisfactorily stand a great external force, so that the strength of attachment of the connecting terminal to the circuit board can be increased. Further, each leg need not have a large-diameter cross section, so that its thermal capacity is as small as those of lead wires of other electric components mounted on the circuit board, and hence the flow soldering can be effected satisfactorily. Also, the through holes in the circuit board, in which the three legs are inserted individually, are formed independently of one another, and therefore, have a small diameter. This makes it possible to prevent damage to the conduction path on the circuit board which would otherwise be liable to occur upon application of an external force.

Preferably, each of the first and second supporting portions is shaped such that the outermost region of the contact surface of each supporting portion, which engages the circuit board when the first, second and third legs are inserted in the through holes of the circuit board, a corresponding one of the first and second legs, and the third leg form an isosceles triangle on the face of the circuit board. If an external force is applied to the connecting terminal, therefore, equal loads act on the first or second leg and third legs, so that the connecting terminal can stand even a great external force. Since the stopper knot is formed on at least one of the first, second, and third legs, moreover, the legs can bite well into solder, so that connecting terminal can stand a great external force.

According to still another aspect of the present invention, each of the connecting terminals, which are included in the connecting terminal assembly adapted for use with the automatic loader, is provided with the plate-shaped body, the first to third legs, and the first and second supporting portions. With respect to the connecting terminals each separated from the connecting terminal assembly to be attached to the circuit board by means of the automatic loader, therefore, the attachment strength can be increased, the flow soldering can be performed, and the conduction path on the circuit board can be prevented from being damaged. In the application of the present invention to the connecting terminal assembly in which the connecting terminals are adhered to the lead frame by means of tape, efficiency of material utilization in the manufacture of the connecting terminals can be improved, while enjoying the aforementioned various advantages.

DETAILED DESCRIPTION

With reference to the accompanying drawings, a tab terminal assembly according to one embodiment of the present invention will now be described.

Figure 1:
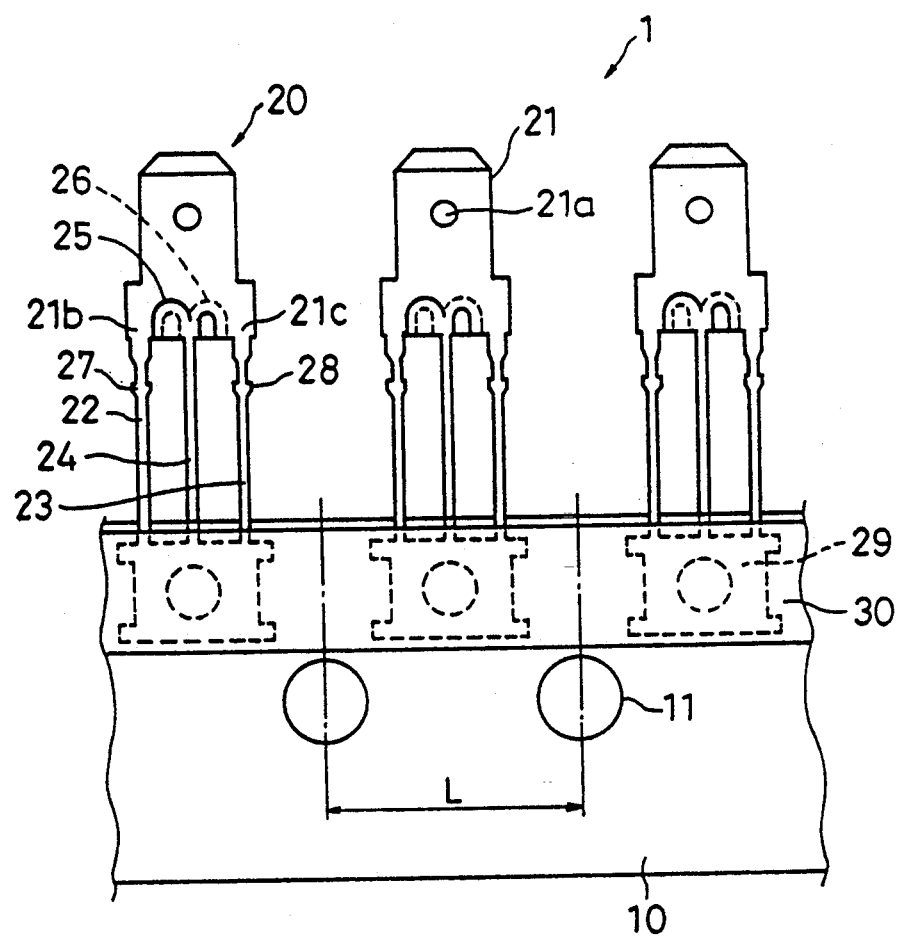
FIG. 1 is a front view showing a tab terminal assembly according to one embodiment of the present invention.
Figure 2:
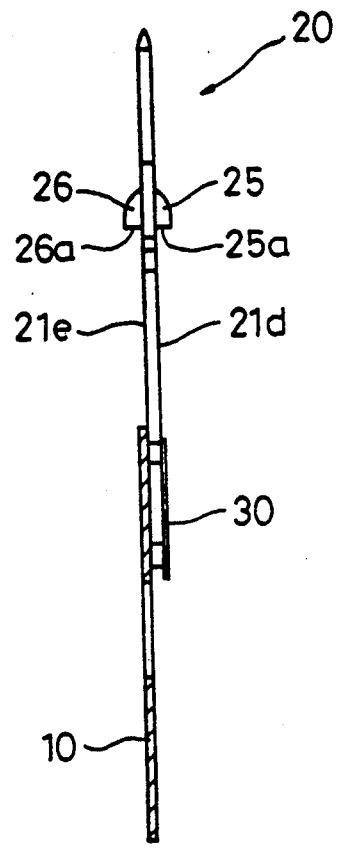
FIG. 2 is a side view, partially in section, showing the tab terminal assembly of FIG. 1.

Referring to FIGS. 1 and 2, the tab terminal assembly 1 comprises a lead frame 10 and a plurality of tab terminals 20 fabricated separately from the frame 10. These tab terminals 20 are used for electrical connection between a conduction path on a circuit board, e.g., a conductor pattern (denoted by reference numeral 41 in FIG. 5) formed on a printed board (denoted by numeral 40 in FIG. 5), and an external electric circuit (not shown). The terminals 20 are arranged at regular intervals and adhered to the lead frame 10 by means of adhesive tape 30. The lead frame 10 is formed with a number of perforations 11 which are arranged at regular intervals and into which feed teeth of a sprocket of an automatic tab terminal loader (not shown) are engagedly fitted, so that the assembly 1 is transported as the sprocket rotates. A commercially available automatic electronic component loader may be used as the tab terminal loader, by way of example.

Each tab terminal 20 has a plate-shaped body 21, thereof adapted to be fitted with a receptacle block 50 (in FIG. 5) which is connected to the external electric circuit. Numeral 21a denotes a recess formed in the body 21 which receives a pin of the receptacle. The tab terminal body 21 is provided at its opposite sides in the crosswise direction with first and second legs 22 and 23 formed integrally therewith. Also, a third leg 24 is formed integrally with the terminal body 21 between the first and second legs 22 and 23, preferably halfway between the legs, with respect to the crosswise direction. The first, second, and third legs 22, 23 and 24 of the tab terminal 20 are adapted to be inserted individually in three separate through holes 42, 43 and 44 (FIG. 5), which are formed in the printed board 40 in association with the tab terminal concerned. Preferably, each of the legs 22, 23 and 24 is formed of a rod having a circular cross section, and each of the through holes 42, 43 and 44 of the printed board is formed of a circular hole.

The tab terminal body 21 includes a first edge region 21b ranging from the first leg 22 to the third leg 24 and a second edge region 21c ranging from the second leg 23 to the third leg 24. In the first edge region 21b of the tab terminal body 21, a first supporting portion 25 for supporting the body 21 on the printed board 40 protrudes from one major surface 21d of the body 21. In the second edge region 21c, a second supporting portion 26 for supporting the body 21 on the printed board 40 protrudes from the other major surface 21e of the body 21. Each of the supporting portions 25 and 26 is formed, for example, by press molding, in the shape of a hollow quarter ellipsoid which may be obtained by quadrisecting a hollow ellipsoid of revolution. Bottom surfaces 25a and 26a (FIG. 2) of these supporting portions are designed so as to engage a board face (denoted by numeral 40a in FIG. 5) of the printed board along a semicircular arc each. In other words, each supporting portion 25 or 26 is formed into a shape such that it has a contact surface (bottom surface) 25a or 26a which is adapted to engage the printed board face 40a when the first, second and third legs 22, 23 and 24 are respectively inserted in the through holes 42, 43 and 44 of the printed board 40, and which has an outermost region 25b or 26b thereof cooperating with the third leg 24 and a corresponding one of the first and second legs 22 and 23 to form an isosceles triangle (FIG. 6) on the face 40a.

Further, outwardly projecting stopper knots 27 and 28 are formed integrally with the first and second legs 22 and 23 of each tab terminal.

Figure 3:
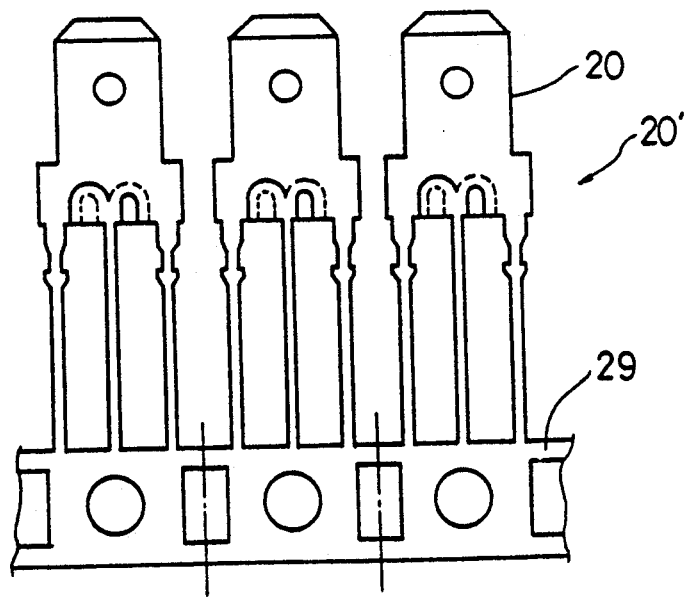
FIG. 3 is a front view showing a tab terminal strip from which the tab terminals shown in FIG. 1 are obtainable.

In manufacturing the tab terminal assembly 1 with the construction described above, a tab terminal strip (denoted by numeral 20' in FIG. 3), which is composed of the plurality of tab terminals 20 and a frame portion 29 integral therewith, is stamped out from a metal strip (not shown), and the frame portion 29 of the strip 20' is cut at the points between the adjacent tab terminals, whereupon the independent tab terminals 20 are obtained. In FIG. 3, one-dotted chain lines represent cut lines, individually. The independent tab terminals 20 thus obtained are arranged on the lead frame 10 at intervals equal to perforation intervals L such that each terminal 20 is situated halfway between each two adjacent perforations 11 in the frame 10. Then, the respective frame portions 29 of the tab terminals 20 are adhered to the lead frame 10 by means of the adhesive tape 30.

Figure 4:
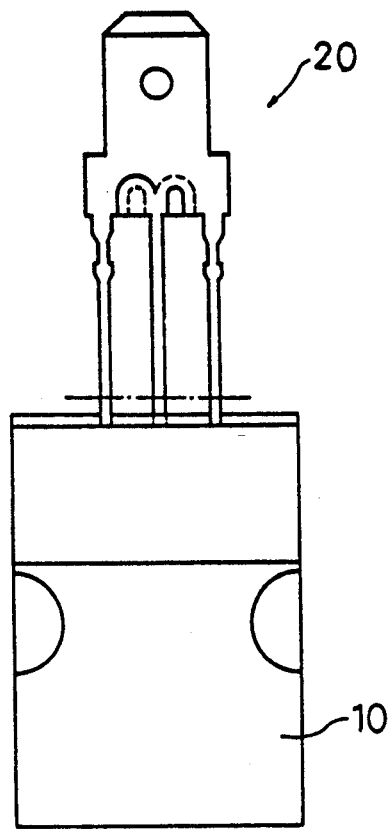
FIG. 4 is a front view showing a combination of a tab terminal and a lead frame which are separated from the tab terminal assembly.

In mounting the tab terminals 20 on the printed board 40, the perforations 11 of the lead frame 10 of the tab terminal assembly 1 are caused to engage the sprocket of the automatic loader, and the loader is then actuated to rotate the sprocket. By doing this, the assembly 1 is transported to the position where its leading tab terminal 20 faces a chuck (not shown) of the loader. After the body 21 of the leading terminal is held by means of the chuck, the chuck is moved so that the assembly 1 is delivered to the position where it faces a cutter (not shown) of the loader. Then, the tab terminal assembly 1 is cut along the boundary (generally indicated by one-dotted chain line in FIG. 1) between the leading tab terminal 20 and its subsequent one by means of the cutter, whereby a combination (FIG. 4) of the leading tab terminal 20 and the lead frame 10 associated therewith is separated from the tab terminal assembly 1. Further, after the chuck is horizontally turned to rotate the combination of the leading tab terminal 20 and the lead frame 10 through 90° around the cutter, the junction between the terminal 20 and the frame 10 is cut along a cut line indicated by one-dotted chain line in FIG. 4, by means of the cutter. Thereupon, the lead frame 10 is separated from the tab terminal 20.

Figure 5:
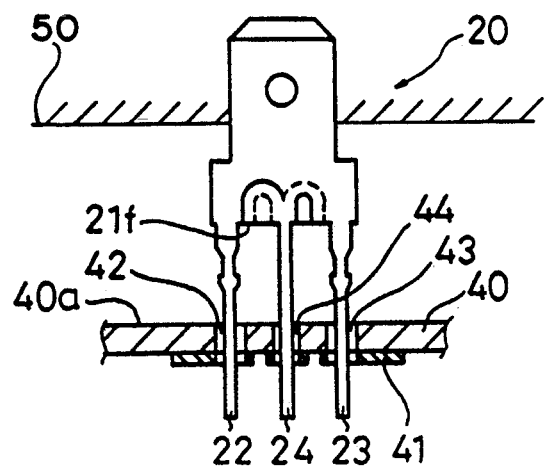
FIG. 5 is a front view, partially in section, showing the tab terminal separated from the combination shown in FIG. 4, to be attached to a printed board.
Figure 6:
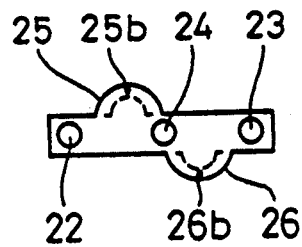
FIG. 6 is a view showing a contact portion between the tab terminal and the printed board.

Subsequently, the chuck is moved to locate the tab terminal 20 in a position such that the first to third legs 22, 23 and 24 of the terminal face the three through holes 42, 43 and 44 of the printed board 40, respectively. Thereafter, the chuck is moved so that the terminal legs are inserted individually into the through holes (FIG. 5). After the chuck is released so that the tab terminal 20 is disengaged from the chuck, the terminal 20 is pressed by means of a pusher (not shown) of the automatic loader so that the terminal legs 22, 23 and 24 are further pushed into their corresponding through holes 42, 43 and 44. By doing this, a leg-side edge portion 21f of the tab terminal body 21 is caused to abut against the printed board face 40a. Then, extra portions of the terminal legs 22, 23 and 24 are cut off, whereupon automatically loading the printed board 40 with the leading tab terminal 20 is finished.

Thereafter, the printed board 40 is automatically loaded with the subsequent tab terminals 20 in the same manner as the leading tab terminal 20, and if necessary, the printed board is loaded with the respective lead wires of other electric and electronic components (not shown). Then, the three legs 22, 23 and 24 of each tab terminal 20 and the respective lead wires of the electric and electronic components are connected electrically and mechanically to the conductor pattern 41 of the printed board 40 by flow soldering using a molten solder bath. Thereupon, mounting the tab terminals and the electric and electronic components on the printed board is finished. Subsequently, each of the receptacles, which are connected to the external electric circuit, is fitted on the body 21 of its corresponding tab terminal, whereupon electrical connection between the conductor pattern 41 of the printed board and the external circuit is established.

If an external force directed from the surface 21d of the tab terminal body 21 for the first supporting portion 25 to the surface 21e for the second supporting portion 26 is applied to each tab terminal 20, during the assembly or manufacture of the printed board 40 and its peripheral components, including mounting the tab terminals 20 and the other electric components on the printed board, or during the use of the printed board, the force is received by the first to third legs 22, 23 and 24 and the second supporting portion 26. Since the external force is thus received by the three terminal legs and the one supporting portion, loads act on the legs without any substantial imbalance. Since the outermost region 26b of the contact surface 26a of the second supporting portion 26, which engages the circuit board 40, and the second and third legs 23 and 24 form an isosceles triangle on the board face 40a (FIG. 6), uniform loads act on the second and third legs 23 and 24 when the external force is applied to each tab terminal 20. Since the stopper knots 27 and 28 are formed on the first and second legs 22 and 23, respectively, moreover, the legs 22 and 23 can bite well into solder. In consequence, the tab terminals 20 can satisfactorily stand even a great external force. If an external force acting in the opposite direction is applied to each tab terminal 20, it is received by the three legs 22, 23 and 24 and the first supporting portion 25. For the same reason as aforesaid, therefore, the tab terminals 20 can satisfactorily stand even a great external force. Also, the through holes 42, 43 and 44 in the circuit board, in which the three legs 22, 23 and 24 are inserted individually, are formed independently of one another, and therefore, have a small diameter. Thus, the possibility of the conduction path on the circuit board being damaged by the external force is lowered considerably. Since the external force is dividedly received by the three legs 22, 23 and 24, moreover, each leg need not have a large-diameter cross section, its thermal capacity is small, and the flow soldering can be effected satisfactorily.

Figure 7:
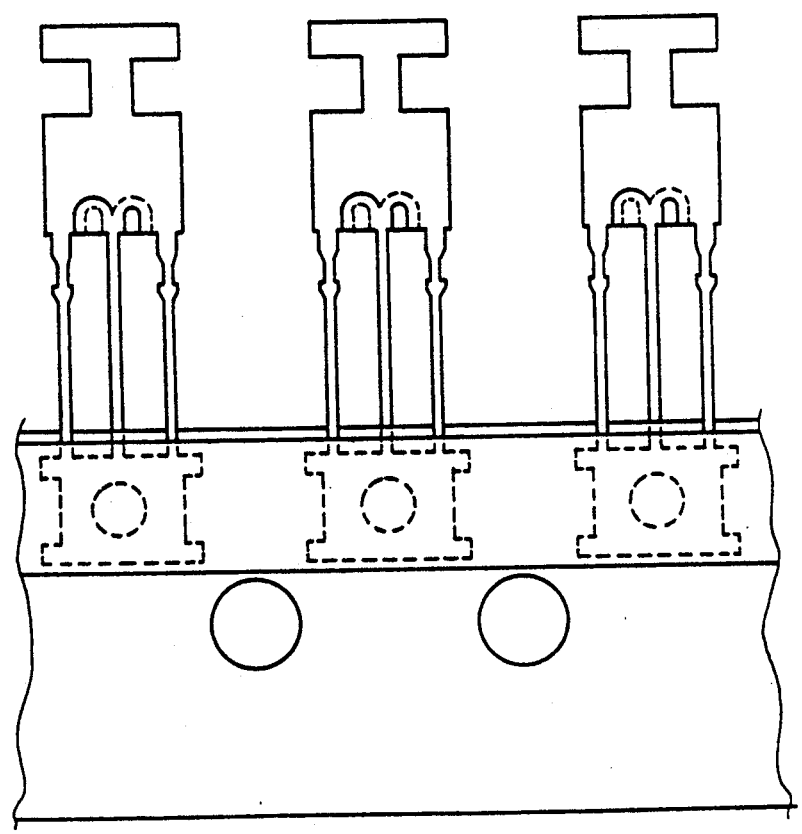
FIG. 7 is a front view of a lug terminal assembly according to another embodiment of the present invention.

In the embodiment described above, the present invention is applied to the tab terminals 20 and the tab terminal assembly 1. However, the invention may be also applied to lug terminals and a lug terminal assembly (FIG. 7). In this case, each lug terminal is designed so that a lead wire connected to an external electric circuit can be wound around its body. In the foregoing embodiment, moreover, the tab terminal assembly 1 is obtained by sticking the plurality of tab terminals 20 to the lead frame 10 by means of the tape 30, the terminals 20 being obtained by cutting the tab terminal strip 20' with the tab terminals 20 arranged thereon at intervals shorter than the intervals between the sprocket teeth of the automatic loader, in order to improve the efficiency of utilization of the strip 20' as a material. Alternatively, however, a tab terminal strip having tab terminals arranged at intervals equal to the sprocket tooth intervals may be used as the tab terminal assembly. In this case, perforations are formed in the strip at intervals equal to the sprocket tooth intervals.

What is claimed is:

1. A connecting terminal for establishing electrical connection between a conduction path on a circuit board and an external electric circuit, comprising:
   a body;
   first, second, and third legs integrally formed on said body and inserted individually in separate through holes formed in the circuit board, said first and second legs being arranged on opposite sides of said body, respectively, in a width direction of said body, said third leg being located halfway between said first and second legs;
   first supporting means for supporting said body on the circuit board, said first supporting means protruding from a first major surface of said body, in a first edge region ranging from said first leg to said third leg; and
   second supporting means for supporting said body on the circuit board, said second supporting means protruding from a second major surface of said body, in a second edge region ranging from said second leg to said third leg, said first and second supporting means balancing a load applied to two of said first, second and third legs as a result of an external force, such that said connecting terminal withstands the applied load.

2. The connecting terminal of claim 1, wherein each of said first and second supporting means is formed such that each of said first and second supporting means includes a contact surface adapted to engage the circuit board when said first, second, and third legs are inserted individually in the through holes of the circuit board, and an outermost region which cooperates with said third leg and a corresponding one of said first and second legs to form an isosceles triangle on a face of the circuit board.

3. The connecting terminal of claim 1, wherein said connecting terminal is a tab terminal including a body fitted with a receptacle connected to the external electric circuit.

4. The connecting terminal of claim 1, wherein said connecting terminal is a lug terminal including a body around which a lead wire connected to the external electric circuit is wound.

5. The connecting terminal of claim 1, wherein at least one of said first, second, and third legs includes an outwardly projecting stopper knot, formed integrally therewith.

6. The connecting terminal of claim 1, wherein said body is plate-shaped.

7. A connecting terminal assembly including a lead frame formed with a plurality of holes arranged at regular intervals into which feed teeth of a sprocket of an automatic loader are engagedly fitted and a plurality of connecting terminals arranged at regular intervals on the lead frame for electrical connection between a conduction path on a circuit board and an external electric circuit, each of said plurality of connecting terminals comprising:
   a body;
   first, second, and third legs integrally formed on said body and inserted individually in separate through holes formed in the circuit board, said first and second legs being arranged on opposite sides of said body, respectively, in a width direction of said body, said third leg being located halfway between said first and second legs;

first supporting means for supporting said body on the circuit board, said first supporting means protruding from a first major surface of said body, in a first edge region ranging from said first leg to said third leg; and second supporting means for supporting said body on the circuit board, said second supporting means protruding from a second major surface of said body, in a second edge region ranging from said second leg to said third, leg said first and second supporting means balancing a load applied to two of said first, second and third legs as a result of an external force, such that said connecting terminal withstands the applied load.

8. The connecting terminal assembly of claim 7, wherein said plurality of connecting terminals are attached to the lead frame with tape.

9. The connecting terminal assembly of claim 6, wherein said body is plate-shaped.

10. A connecting terminal for establishing electrical connection between a conduction path on a circuit board and an external electric circuit, comprising:

a body;

first, second, and third legs integrally formed on said body and inserted individually in separate through holes formed in the circuit board, said first and second legs being arranged on opposite sides of said body, respectively, in a width direction of said body, said third leg being located halfway between said first and second legs;

first supporting means for supporting said body on the circuit board, said first supporting means protruding from a first major surface of said body, in a first edge region ranging from said first legs to said third leg; and second supporting means for supporting said body on the circuit board, said second supporting means protruding from a second major surface of said body, in a second edge region ranging from said second leg to said third leg;

wherein each of said first and second supporting means is formed such that each of said first and second supporting means includes a contact surface adapted to engage the circuit board when said first, second, and third legs are inserted individually in the through holes of the circuit board, and an outermost region which cooperates with said third leg and a corresponding one of said first and second legs to form an isosceles triangle on a face of the circuit board.

11. The connecting terminal of claim 10, wherein said connecting terminal is a tab terminal including a body fitted with a receptacle connected to the external electric circuit.

12. The connecting terminal of claim 10, wherein said connecting terminal is a lug terminal including a body around which a lead wire connected to the external electric circuit is wound.

13. The connecting terminal of claim 10, wherein at least one of said first, second, and third legs includes an outwardly projecting stopper knot, formed integrally therewith.

14. A connecting terminal assembly including a lead frame formed with a plurality of holes arranged at regular intervals into which feed teeth of a sprocket of an automatic loader are engagedly fitted and a plurality of connecting terminals arranged at regular intervals on the lead frame for electrical connection between a conduction path on a circuit board and an external electric circuit, each of said plurality of connecting terminals comprising:

a body;

first, second, and third legs integrally formed on said body and inserted individually in separate through holes formed in the circuit board, said first and second legs being arranged on opposite sides of said body, respectively, in a width direction of said body, said third leg being located halfway between said first and second legs;

first supporting means for supporting said body on the circuit board, said first supporting means protruding from a first major surface of said body, in a first edge region ranging from said first leg to said third leg; and second supporting means for supporting said body on the circuit board, said second supporting means protruding from a second major surface of said body, in a second edge region ranging from said second leg to said third leg;

wherein each of said first and second supporting means is formed such that each of said first and second supporting means includes a contact surface adapted to engage the circuit board when said first, second, and third legs are inserted individually in the through holes of the circuit board, and an outermost region which cooperates with said third leg and a corresponding one of said first and second legs to form an isosceles triangle on a face of the circuit board.

15. The connecting terminal assembly of claim 14, wherein said plurality of connecting terminals are attached to the lead frame with tape.

16. The connecting terminal of claim 10, wherein said body is plate-shaped.

17. The connecting terminal assembly of claim 14, wherein said body is plate-shaped.

* * * * *